Sept. 19, 1961 C. W. MUELLER 3,001,113
SEMICONDUCTOR DEVICE ASSEMBLIES
Filed Oct. 6, 1959 2 Sheets-Sheet 1

INVENTOR.
Charles W. Mueller
BY
W. S. Hill
AGENT

Sept. 19, 1961 C. W. MUELLER 3,001,113

SEMICONDUCTOR DEVICE ASSEMBLIES

Filed Oct. 6, 1959 2 Sheets-Sheet 2

INVENTOR.
Charles W. Mueller
BY
W.S. Hill
AGENT 3,001,113
Patented Sept. 19, 1961

3,001,113

SEMICONDUCTOR DEVICE ASSEMBLIES

Charles W. Mueller, Princeton, N.J., assignor to Radio Corporation of America, a corporation of Delaware Filed Oct. 6, 1959, Ser. No. 844,663
6 Claims. (Cl. 317—236)

Figure 1:
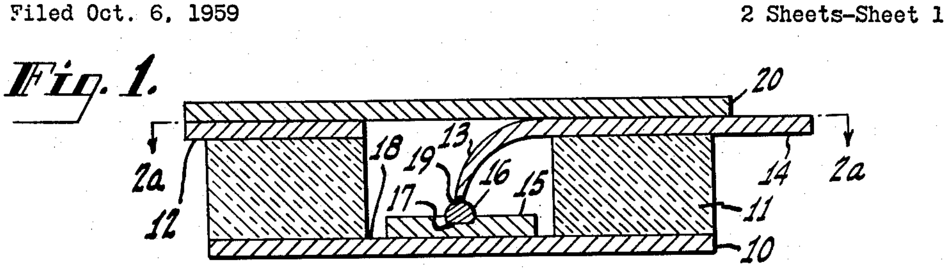

This invention relates to semiconductor device assemblies, and more particularly to improved hermetically sealed enclosures for semiconductor devices.

Semiconductor devices such as diodes and transistors are adversely affected by moisture, dust, acids, corrosive ambients, and the like. It is therefore standard practice to case semiconductive devices in hermetically sealed enclosures, which may be made of glass or a ceramic, but are commonly made of metal. Metal enclosures are preferred, as they are easily sealed and readily conduct to a heat sink the heat dissipated by the devices.

In order to attain high frequency operation, it is desirable that the dimensions of a semiconductor device, including the enclosure, are so small that they may be advantageously used for direct insertion in printed circuit boards, strip transmission line circuits, and the like. However, when the devices are hermetically sealed and cased by known methods the volume and weight of the completed assembly are often too high for such applications. It is known that the resistance and impedance introduced by the case affect the performance of the device at high frequencies.

Two-terminal devices such as semiconductor diodes have been mounted by brazing a ceramic washer to a metal plate, soldering a semiconductor wafer to a pedestal on the plate within the washer, brazing a metal washer to the ceramic washer, and bonding a metal cover member to the metal washer. The cover member includes a protuberant central portion which contacts the upper surface of the semiconductor wafer. However, it is frequently desirable to etch the semiconductor unit after electrical contact has been made to the wafer, and it is always desirable to inspect the unit visually to check if good contact has been made. Improvement in the above construction is desirable, since in the aforesaid enclosure the electrical contact is made by the cover member itself, and after the cover is in place the semiconductor unit can neither be etched nor the contact visually inspected. Furthermore, the above device assembly requires pressures of about 3000 lbs. per sq. inch and temperatures of about 325° C. for periods up to five minutes in order to hermetically seal the unit. Such elevated temperatures and pressures increase the cost of each unit and increase the percentage of unsatisfactory units or scrap. It is therefore desirable to provide an improved enclosure which is inexpensive and which can be readily sealed without employing temperatures and pressures so high as to damage the semiconductor crystal.

Accordingly, it is an object of the present invention to provide improved semiconductor devices having improved enclosures.

Another object of the invention is to provide an inexpensive enclosure for semiconductor devices.

Yet another object is to provide a semiconductor device enclosure which can be readily sealed without employing high temperatures and pressures.

Still another object is to provide an improved enclosure for high frequency semiconductor devices.

But another object is to provide an improved semiconductor device enclosure especially adapted for etching and inspection of the semiconductor unit prior to sealing the assembly.

In accordance with the invention, an improved semiconductor device enclosure is fabricated by preparing a conductive plate having two opposed major faces, and bonding an insulating washer to one major face. The seal between the washer and the plate is of the hermetic type. An annular conductive member is then hermetically sealed to the insulating washer. The annular member contains at least one interior lobe. A semiconductor wafer is bonded to the same one major face within the washer. Next, the interior lobe of the annular member is bent down so as to form an electrical contact with the semiconductor wafer. A feature of the invention is that the electrical contact may now be inspected prior to the final sealing of the enclosure. If desired, the unit may at this stage be treated with an etchant to clean up the surface of the semiconductor wafer. Thereafter, a conductive plate is bonded to the annular member so as to seal the unit.

Figures 2A, 2B:
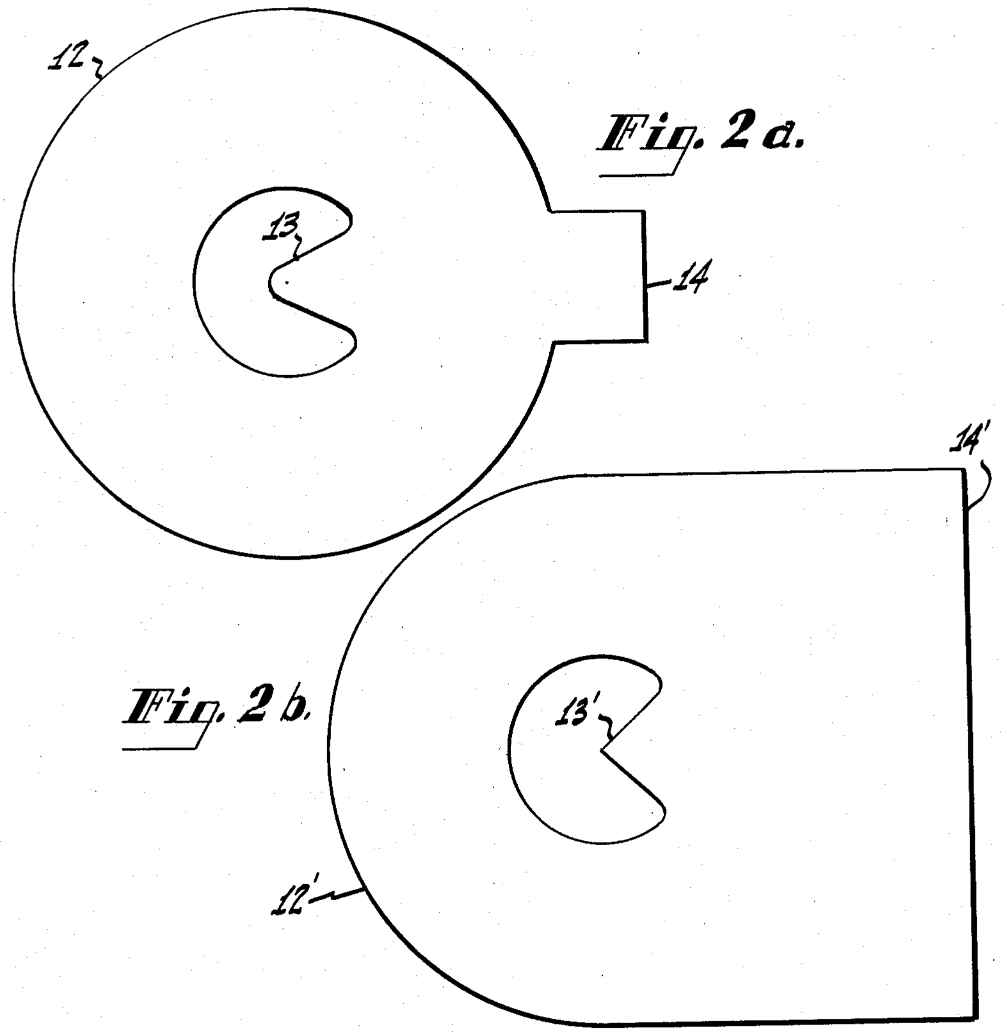
Figure 2C:
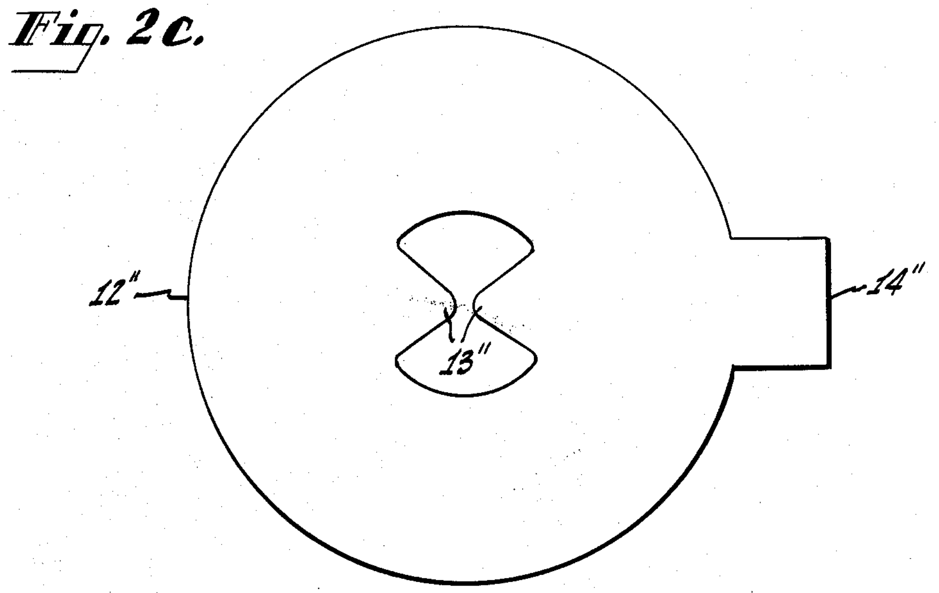
Figure 3:
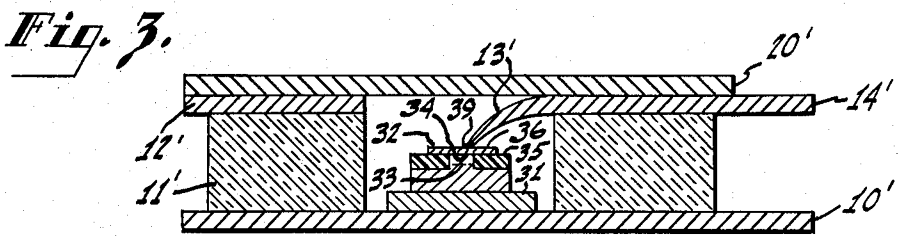
Figure 4:
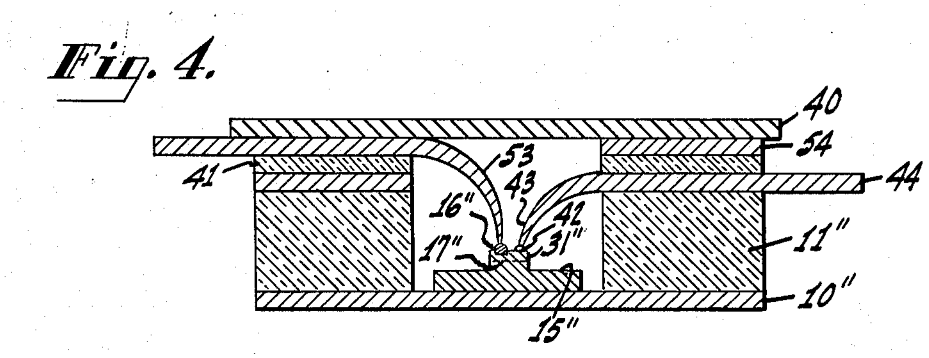

The novel features which are considered characteristic of the invention are set forth with particularity in the appended claims. The invention itself, however, both as to its organization and method of operation, as well as additional objects and advantages thereof, will best be understood from the following detailed description of three examples, when read in conjunction with the accompanying drawings, in which:

FIGURE 1 is a sectional view of a two-terminal semiconductor device embodying the invention;

FIGURES 2*a*, 2*b*, and 2*c* are plan views of alternate shapes of lobed annular members useful in the invention;

FIGURE 3 is a sectional view of another two-terminal semiconductor device according to the invention; and, FIGURE 4 is a sectional view of a transistor in an enclosure embodying the invention.

*Example I*

Reference is now made to FIGURE 1, which is a sectional view of a typical two-terminal semiconductor device according to one embodiment of the invention. The device shown is a single-junction diode of the surface alloyed type. It will be understood that other types of units, such as diffused junction and grown junction diodes, may be used instead. The invention may also be utilized with two-terminal PNPN diodes of the type described by W. Shockley, "Unique Properties of the Four-Layer Diode," Electronic Industries, August 1957. The invention is particularly suitable for negative resistance tunnel diodes and for variable capacitance parametric diodes.

In this embodiment, the enclosure is fabricated by preparing a conductive plate 10 with two opposing major faces. The exact dimensions of the plate are not critical. The plate may be made of a conductive plastic, or a conductive glass, but is preferably formed of metals such as nickel, molybdenum, and the like, or alloys such as Kovar and Fernico. The term "metal" will be used hereinafter and in the claims as including both pure metals and alloys. In this example, the plate 10 is a Kovar disc about 125 mils in diameter and 2 mils thick.

A washer 11 of insulating material is sealed to the periphery of one major face of plate 10 to form therewith a cup. The washer 11 is composed of materials with a high dielectric constant, such as glass, for example, glass frit, quartz, Pyroceram, Photoceram, or the like, ceramic, for example, forsterite steatite, alumina, or the like, or similar insulating materials such as sapphire and Ceramicon. For high frequency operation it is desirable to utilize a washer 11 composed of low loss materials, such as high alumina compositions. In this example, the insulating washer 11 has an external diameter of 85 mils, an internal diameter of 55 mils, is about 40 mils thick and is made of a ceramic composed of 92 weight percent alumina, balance silica and manganese dioxide.

The washer 11 is sealed to plate 10 by any of the suitable methods used in making glass-to-metal and ceramic-to-metal seals. These processes involve metallizing the desired surface of the insulating washer 11, for example by sintering powdered metals such as molybdenum and tungsten over the desired surface of the body. Alternatively, powdered oxides of molybdenum or tungsten or mixtures of the two oxides, are suspended in an organic binder and applied to the surface of the washer, which is then fired in a reducing atmosphere so as to form a metal film over the surface of the washer. The adherent metal film thus produced is readily brazed to the face of plate 10, using, for example, brazes of the gold-nickel type. Other methods of making ceramic-to-metal seals are known in the art, and any convenient method may be utilized. In this example, one surface of washer 11 is coated with an ink composed of powdered molybdenum suspended in an organic binder. The coated washer is fired in a hydrogen atmosphere at 1450° C. to form a deposit of molybdenum metal on the washer surface. The washer 11 is then positioned with a metallized side down on one face 18 of plate 10. Washer and plate are heated together in a hydrogen atmosphere to a temperature of 1125° C. To insure a hermetic seal between the washer and the plate, it is advantageous to utilize a plate which has been previously clad with copper on the one face 18.

Next, an annular member 12, of which FIGURE 2 is a plan view, is similarly bonded to the exposed surface of insulating washer 11 opposite plate 10. Member 12 is preferably composed of the same material as base plate 10, and in this example consists of Kovar 2 mils thick. Member 12 contains an interior lobe 13 which may be bent below or above the plane of the member. For convenient attachment of lead wires thereto, the member 12 is advantageously formed with an external tail 14 opposite the interior lobe 13. The longest dimension of member 12 in this example is about ¼ of an inch. An alternate for member 12 is shown in FIGURE 2*b*, in which annular member 12' includes an interior lobe 13' having straight sides, and a tail 14' as wide as the external diameter of the annulus of member 12'. If desired, the insulating washer 11 may be bonded between base plate 10 and annular member 12 in a single firing step.

A semiconductor wafer 15 is then bonded by any convenient means, such as soldering, to the one face of base plate 10 within washer 11. If necessary, lobe 13 is bent upwards to provide the necessary clearance for the admission of the wafer. In this example, wafer 15 consists of N-conductivity type germanium which has been heavily doped with arsenic so as to contain about $2 \times 10^{19}$ arsenic atoms per $cm.^3$, and exhibits a resistivity of about .001 ohm-centimeters. The exact size and shape of the wafer is not critical, other than that it must be small enough to fit in the available opening. Suitably, wafer 15 is about 30 mils square and 9 mils thick. The wafer bears on one major face an alloyed electrode pellet 16 of material which induces conductivity of the type opposite to that of wafer 15. In this embodiment, since the wafer is of N-conductivity type, electrode pellet 16 contains an acceptor. A suitable pellet for this purpose is a spherule or dot 3 mils in diameter and composed of 0.5 weight percent gallium, 0.5 weight percent zinc, balance indium. A PN junction 17 is formed at the alloy front between wafer 15 and pellet 16. The diode thus fabricated contains an abrupt junction, and is heavily doped on both sides of the junction to the point of degeneracy. Such units exhibit a negative resistance region when operated with a low forward bias. For a more complete discussion of negative resistance, tunnel diodes, see H. S. Sommers, Jr., "Tunnel Diodes as High-Frequency Devices," Proc. IRE, vol. 47, page 1201, July 1959.

Wafer 15 is conveniently bonded to the copper-clad face 18 of base plate 10 by a solder coating on the wafer face opposite electrode pellet 16. Lobe 13 is then bent down so that the tip of the lobe touches electrode 16 and forms an electrical contact thereto. Advantageously, a droplet of solder 19 may be used to secure the tip of lobe 13 firmly to pellet 16. In this example, a suitable solder is indium or indium-containing alloys.

The enclosure is now sealed by means of conductive plate 20 which is preferably formed of the same material as the annular member 12. In this example, plate 20 is a Kovar disc about 125 mils in diameter and 2 mils thick. Conductive plate 20 is sealed to annular member 14 by spot welding at several points around the periphery. While such a seal is not absolutely hermetic, it is very rapidly and inexpensively formed, and has been found satisfactory for tunnel diodes. For other applications, for example, parametric diodes, a completely hermetic seal may be formed by resistance welding of cover plate 20 all around its circumference to the annular member 12.

It will be understood that various modifications may be made without departing from the spirit and scope of the instant invention. For example, to insure satisfactory electrical connections and good seals, the metal plates 10 and 20, as well as annular member 12, may be coated with electroless nickel or copper and then gold plated. The entire device can have a variety of shapes. The annular member may have two interior lobes 13'' as shown in FIGURE 2*c*. When both lobes 13'' are electrically connected to the semiconductor unit, the capacitance of the assembly is reduced. Other crystalline semiconductor materials such as silicon, silicon-germanium alloys, and crystalline semiconductive compounds such as gallium arsenide, cadmium telluride, silicon carbide, and the like, may be utilized instead of germanium as the wafer material. The conductivity type of the different regions of the semiconductive wafer may be readily reversed, if desired, by using appropriate donors and acceptors for each semiconductor. For example, gallium arsenide units may be similarly fabricated, using zinc or cadmium as the acceptor, and tellurium as the donor.

The diameter of the base plates and the cover plates may vary from about 60 to 150 mils. The thickness of the completed unit is adjusted for the intended frequency of operation. For example, for a parametric diode which is to be inserted in 2000 mc. strip transmission line, the thickness of the enclosure is about 60 mils. For insertion in a 10,000 mc. strip transmission line, the overall thickness of the enclosure is reduced to about 20 mils. The device assembly is inserted in the transmission line by soldering the bottom disc to the base plane of the strip, and soldering the cover plate to the appropriate width of the upper conductor.

*Example II*

Another embodiment of the invention will now be described in connection with FIGURE 3. In this example, the conductive basep late 10' is of the same peripheral outline shape as the annulus shown in FIGURE 2*b*, but is a solid plate. The plate 10' bears on one major face a ceramic washer 11', and a stud or pedestal 31 within the opening of the washer. The pedestal 31 may consist of a body of nickel, Kovar, molybdenum, copper, or the like. A non-magnetic material, like molybdenum, is preferred for operation of the highest frequencies. In this example, pedestal 31 is a block of nickel 18 mils thick which has been brazed to the copper clad major face of plate 13'. Semi-conductor wafer 15' is soldered to the nickel block 31. The wafer 15' is a body of N-conductivity type germanium having a P-conductivity type mesa 32 on the major wafer face opposite the face soldered to pedestal 31. A rectifying barrier or PN junction 33 is formed between the P-type mesa 32 and the N-type bulk of wafer 15'. The P-type region may be formed by any convenient method, such as diffusing an acceptor into the entire wafer face, or by growing a P-type region on the one major face. Thereafter, an acid-resistant film 34 is deposited on a preselected portion of the P-type region where the mesa is desired. In this example, film 34 consists of lead, and is deposited by vacuum evaporation in the form of a circle 3 mils in diameter. The wafer is then etched with an etchant containing nitric acid and hydrofluoric acid to remove the unmasked portion of the P-type region, leaving the P-type plateau or mesa 32 beneath the lead film 34. Since the top of the plateau 32 is only 3 mils in diameter, it is difficult to attach an electrical lead thereto. The surface of wafer 15' is therefore coated with an insulating plastic or resin 35 so as to completely surround the plateau 32, keeping the top of resin coating 35 level with the top of mesa 32. A suitable plastic for this purpose is an epoxy resin, such as that commercially available as Araldite. A layer of conductive metal 36, such as copper or nickel, is then deposited over the plateau 35 in the shape of a 15 mil circle. This technique facilitates the formation of an electrical connection to the mesa 32, since the connection may now be made to an area of the metallic layer 36, 15 mils in diameter, instead of to an area only 3 mils in diameter of the original mesa 32.

An annular member 12', of the shape shown in FIGURE 2b, is brazed to washer 11'. In this example, annular member 12' consists of 2 mil thick copper-clad Kovar. The lobe 13' of member 12' is bent down to contact copper layer 36, and is soldered to layer 36 by means of solder droplet 39. The connection is now inspected and the assembly is washed in 1% hydrochloric acid to remove any surface impurities present. Thereafter the unit is sealed as described above by spot welding Kovar plate 20' to annular member 12'.

Although the instant invention is particularly suitable for two-terminal devices such as positive resistance diodes, PNPN diodes, tunnel diodes, and variable capacitance diodes, it may also be utilized for three-terminal devices such as transistors.

*Example III*

Referring now to FIGURE 4, a transistor unit is shown. A first insulating washer 11'' is sealed to one of the two opposing major faces of conductive plate 10''. Semiconductor wafer 15'' is soldered to the one major face of plate 10'' within the opening of washer 11''. The upper face of wafer 15'' bears a mesa or plateau 31'' of conductivity type opposite that of the bulk of the wafer, so that a rectifying barrier 17'' is formed between the bulk of wafer 15'' and mesa 31''. A rectifying electrode pellet 16'' has previously been alloyed to the upper surface of mesa 31'', as well as an ohmic or non-rectifying electrode 42. A first annular conductive member 44 is then sealed to washer 11'', and lobe 43 of member 44 is bent down to contact ohmic electrode pellet 42. If desired, lobe 43 may be secured to pellet 42 by a droplet of solder (not shown). Next, a second insulating washer 41 is sealed to the top of annular member 44, and a second annular member 54 is sealed to the second washer 41. Lobe 53 of member 54 is bent down to contact rectifying electrode 16''. If desired, lobe 53 may be affixed to electrode 16'' by a droplet of solder (not shown). Thereafter the device is inspected, surface impurities are removed by a means of a dilute etchant, and the unit is sealed by resistance welding conductive plate 40 to the second annular member 54.

Thus, a semiconductor device enclosure is provided which is small, inexpensive, suitable for high frequency operation, and is readily inspected and etched prior to sealing.

What is claimed is:

1. A semiconductor device assembly comprising a first conductive plate, an insulating washer peripherally sealed to said plate, a semiconductor wafer bonded to said plate within said washer, an annular conductive member having one side sealed to said washer, said member having at least one interior lobe, said lobe being bent toward said wafer and forming an electrical contact with said wafer, and a second conductive plate sealed to the opposite side of said annular member, said second plate covering the opening of said annular member and sealing said wafer in the space between said first and second plates.

2. A semiconductor device assembly comprising a first conductive plate having two opposed major faces, an insulating washer peripherally sealed to one said face, a semiconductor wafer bonded to said one face within said washer, an annular conductive member having one side sealed to said washer, said member having an interior lobe, said lobe being bent below the plane of said member toward said wafer and forming an electrical contact with said wafer, and a second conductive plate sealed to the opposite side of said annular member, said second plate covering the opening of said annular member and sealing said wafer in the space between said first and second plates.

3. A semiconductor device assembly comprising a first conductive plate having two opposed major faces, an insulating washer hermetically sealed to one said face, a semiconductor wafer bonded to said one face within said washer, an annular conductive member having one side sealed to said washer, said member having an interior lobe, said lobe being bent below the plane of said member to contact said wafer and forming an electrical contact with said wafer, and a second conductive plate hermetically sealed to the opposite side of said annular member, said second plate covering the opening of said annular member and hermetically sealing said wafer in the space between said first and second plates.

4. A semiconductor device assembly comprising a first conductive plate having two opposed major faces, a ceramic washer hermetically sealed to one said face, a semiconductor wafer bonded to said one face within said washer, an annular conductive member having one side hermetically sealed to said washer, said member having an interior lobe, said lobe being bent below the plane of said member to contact said wafer and forming an electrical contact with said wafer, and a conductive plate hermetically sealed to the opposite side of said annular member, said second plate covering the opening of said annular member and hermetically sealing said wafer in the space between said first and second plates.

5. A semiconductor device assembly comprising a first metal plate having two opposed major faces, a ceramic washer hermetically sealed to one said face, a semiconductor wafer bonded to said one face within said washer, an annular conductive member having one side hermetically sealed to said washer, said member having an interior lobe, said lobe being bent below the plane of said member to contact said wafer and forming an electrical contact with said wafer, and a second metal plate hermetically sealed to the opposite side of said annular member, said second plate covering the opening of said annular member and hermetically sealing said wafer in the space between said first and second plates.

6. A semiconductor device assembly comprising a conductive plate having two opposed major faces, a first insulating washer peripherally sealed to one said face, a semiconductor wafer bonded to said one face within said first washer, a mesa on said wafer, a rectifying electrode and an ohmic electrode alloyed to said mesa, a first annular conductive member sealed to said first washer, said member having an internal lobe, said lobe being bent toward said wafer and forming an electrical contact with said ohmic electrode, a second insulating washer sealed to said first member, a second annular conductive member sealed to said second washer, said second annular member having an internal lobe, said lobe being bent toward said wafer and forming an electrical contact with said rectifying electrode, and a conductive plate sealed to said second annular member.

References Cited in the file of this patent

UNITED STATES PATENTS 2,744,308 Loman ---------------- May 8, 1956